US010636702B2

(12) United States Patent
Wu et al.

(10) Patent No.: US 10,636,702 B2
(45) Date of Patent: Apr. 28, 2020

(54) CONDUCTIVE INTERCONNECT STRUCTURES IN INTEGRATED CIRCUITS

(71) Applicant: Taiwan Semiconductor Manufacturing Company, Ltd., Hsinchu (TW)

(72) Inventors: Jung-Tang Wu, Kaohsiung (TW); Shao Tzu Lien, Zhubei (TW); Chi-Hung Liao, Hsinchu (TW); Szu-Hua Wu, Zhubei (TW); Liang-Yueh Ou Yang, New Taipei (TW); Chin-Szu Lee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/178,470

(22) Filed: Nov. 1, 2018

(65) Prior Publication Data
US 2020/0105593 A1    Apr. 2, 2020

Related U.S. Application Data

(60) Provisional application No. 62/737,310, filed on Sep. 27, 2018.

(51) Int. Cl.
*H01L 21/4763* (2006.01)
*H01L 21/768* (2006.01)
(Continued)

(52) U.S. Cl.
CPC .. *H01L 21/76873* (2013.01); *H01J 37/32357* (2013.01); *H01L 21/67057* (2013.01);
(Continued)

(58) Field of Classification Search
CPC ......... H01L 21/67057; H01L 21/76843; H01L 21/76873; H01L 21/823431;
(Continued)

(56) References Cited

U.S. PATENT DOCUMENTS 5,933,758 A * 8/1999 Jain ..................... H01L 21/2885
438/687
9,105,490 B2   8/2015 Wang et al.
(Continued)

*Primary Examiner* — Brook Kebede
(74) *Attorney, Agent, or Firm* — Slater Matsil, LLP

(57) ABSTRACT

An interconnect structure and a method of forming the interconnect structure are provided. A dielectric layer and openings therein are formed over a substrate. A conductive seed layer is formed over the top surface and along a bottom and sidewalls of the openings. A conductive fill layer is formed over the seed layer. Metal oxide on the surface of the seed layer may be reduced/removed by a surface pre-treatment. The cleaned surface is covered by depositing fill material over the seed layer without exposing the surface to oxygen. The surface treatment may include a reactive remote plasma clean using hydrogen radicals. If electroplating is used to deposit the fill layer, then the surface treatment may include soaking the substrate in the electrolyte before turning on the electroplating current. Other surface treatments may include active pre-clean (APC) using hydrogen radicals; or Ar sputtering using a metal clean version xT (MCxT) tool.

20 Claims, 12 Drawing Sheets

(51) Int. Cl.
*H01J 37/32* (2006.01)
*H01L 21/67* (2006.01)
*H01L 23/522* (2006.01)
*H01L 29/66* (2006.01)
*H01L 21/8234* (2006.01)
*H01L 27/088* (2006.01)
*H01L 29/78* (2006.01)
*H01L 23/532* (2006.01)

(52) U.S. Cl.
CPC .......... *H01L 21/76843* (2013.01); *H01L 21/823431* (2013.01); *H01L 23/5226* (2013.01); *H01L 23/53209* (2013.01); *H01L 27/0886* (2013.01); *H01L 29/66545* (2013.01); *H01L 29/66795* (2013.01); *H01L 29/785* (2013.01)

(58) Field of Classification Search
CPC .......... H01L 23/5226; H01L 23/53209; H01L 27/0886; H01L 29/66545; H01L 29/66795; H01L 29/785; H01J 37/32357
USPC ................................ 438/618–630
See application file for complete search history.

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2003/0190426 A1* | 10/2003 | Padhi ............. | C23C 18/1651 427/307 |

* cited by examiner

CONDUCTIVE INTERCONNECT STRUCTURES IN INTEGRATED CIRCUITS

This application claims the benefit of U.S. Provisional Application No. 62/737,310, filed on Sep. 27, 2018, which application is hereby incorporated herein by reference.

BACKGROUND

The semiconductor industry has experienced rapid growth due to continuous increase in functionality and speed of integrated circuits for any given cost. This has been enabled primarily by continuous improvements in the integration density of functional circuit blocks, e.g., memory arrays, digital logic gates, differential amplifiers and the like. This increase in density has been achieved by two means: (1) increased planar density due to repeated reductions in minimum feature size and, (2) increased vertical integration achieved by stacking an increasing number of interconnect levels and components. The former allows for a denser placement of electronic components (e.g., transistors) and metal conductors at any given level, whereas the latter allows for placement of components and routing signals and power lines using multiple levels located vertically above each other.

A majority of electronic components are formed in a semiconductor substrate. These, as well as other electronic components, are connected to each other and to external signals and power supplies according to a circuit design to construct an integrated circuit (IC). These connections are achieved by conductive interconnect structures, such as lines and vias that collectively constitute a multilevel interconnect system with its elements formed at multiple discrete levels above the substrate.

BRIEF DESCRIPTION OF THE DRAWINGS

For a more complete understanding of the disclosed embodiments and the advantages thereof, reference is made to the following description taken in conjunction with the accompanying drawings, in which.

Corresponding numerals and symbols in the different figures generally refer to corresponding elements, unless otherwise indicated. The figures are drawn to representatively illustrate relevant aspects of disclosed embodiments and are not necessarily drawn to scale.

DETAILED DESCRIPTION

Figure 1:
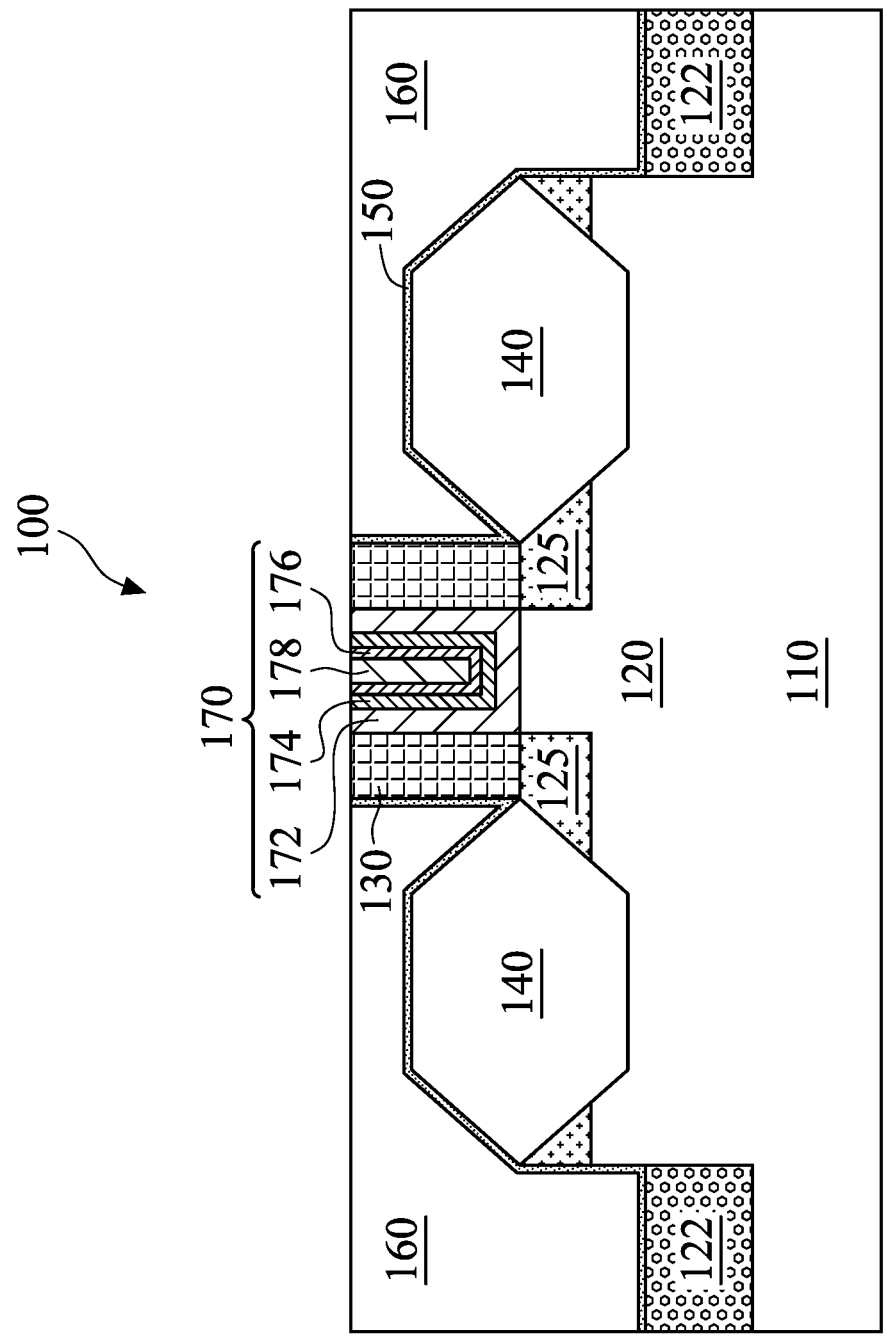
FIG. 1 illustrates a cross-sectional view of a FinFET where the cross-section is taken along a fin in a direction parallel to the direction of current flow in the channel in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following disclosure provides many different embodiments, or examples, for implementing different features of the invention. Specific examples of materials, structures, and fabrication processes are described below to illustrate the inventive concepts. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

This disclosure describes elements of a multilevel interconnect system comprising conductive interconnect structures of conductive lines, contacts, and vias used to connect an electronic device in an integrated circuit in the context of forming a fin field effect transistor (FET), commonly called a FinFET. The disclosed embodiments include methods of forming the conductive interconnect structures using surface preparation processes and deposition of the conductive materials used in forming the conductive interconnect structures. While the disclosure discusses aspects in the context of a FinFET, other embodiments may be utilized with other electronic devices, e.g., a planar metal-oxide-semiconductor FET (MOSFET), an MOS capacitor, a diffusion resistor, a body contact, or the like. Aspects of the present disclosure may further be utilized in upper metallization layers to form interconnections between the various electronic devices formed on a substrate. Additionally, connections to electrodes of electronic devices formed above a substrate may be established with interlevel connectors formed using some of the inventive aspects of this disclosure. Exemplary electronic devices formed above a substrate include metal-insulator-metal (MIM) capacitors, thin-film resistors, inductors, microelectromechanical system (MEMS) components e.g., digital mirror devices, infrared bolometer arrays, inkjet printheads, etc., and the like. Other embodiments may also be utilized.

As a conductor's dimension in a direction primarily perpendicular to the direction of the flow of electrical current is decreased, a disproportionately large reduction in electrical conductance per unit cross-sectional area of the conductor can occur. The relative magnitude of such a reduction in conductance may depend on the minimum dimension and the properties of the conductive (e.g., metallic) materials used to form the conductor (e.g., copper, aluminum, tungsten, cobalt, ruthenium and combinations and alloys thereof). Embodiments described herein provide conductors with improved operating characteristics, especially at ultra-small cross-sectional areas. For example, some embodiments utilize cobalt as the principal conductive material. Further, the embodiments of this disclosure include process steps used in the surface preparation and subsequent electrochemical plating method to deposit cobalt to reduce or eliminate the presence of a thin cobalt oxide layer that can impede the conduction of current in the conductors. Thus, the embodiments of this disclosure can enable a reduction in the time required to electrically access electronic devices (e.g., transistors) and can thereby improve the performance of an electrical circuit that uses the electronic devices in its electrical design. Accordingly, this disclosure is advantageous for fabrication of and miniaturization of the state-of-the-art integrated circuits.

Interlevel connectors that connect to electronic components formed in a substrate are usually referred to as contacts. In this disclosure the formation of contacts are illustrated in the context of connecting to the electrodes of a FinFET. The name FinFET reflects the fin-like semiconductor structures protruding from a substrate on which the FET is constructed. The FinFET is a device where the vertical dimension is exploited to reduce its footprint relative to the planar FET structure. A gate structure, configured to control the flow of charge carriers within a conductive channel of the FinFET device, wraps around the sides of the semiconductor fins. For example, in a tri-gate FinFET device, the gate structure wraps around three sides of the semiconductor fin, thereby forming conductive channels along the surfaces of the semiconductor fin covered by the gate. A method to form the FinFET device is briefly described but it is understood that there are a multiplicity of process integration options by which these transistor structures may be manufactured.

FIG. 1 illustrates a cross-section view of a tri-gate FinFET 100 formed on a substrate 110. Generally, the substrate 110 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as, germanium, silicon germanium, or combinations thereof. The semiconductor materials may be doped or undoped. Other substrates that may be used include multi-layered substrates, gradient substrates, or hybrid orientation substrates.

The cross-section shown in FIG. 1 is taken along a longitudinal axis of the fin in a direction parallel to the direction of the current flow and going through the center of the fin 120. The exemplary fin 120 may be formed by patterning the substrate using photolithography and etching techniques. For example, the spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a mask to pattern the respective fin 120 by etching a trench into the substrate 110 using, for example, reactive ion etching (RIE).

Shallow trench isolation (STI) regions 122 are formed in the space between adjacent fins and along the ends of the fins. An STI formation method may comprise deposition of one or more insulation materials, followed by a planarization process, such as a chemical mechanical polish (CMP) that may remove any excess insulation material and first form a top surface of the isolation region and a top surface of the fin 120 to be coplanar. The CMP process is then followed by a selective etch process that may recess the isolation region such that the upper portion of fin 120 protrudes from between neighboring STI regions 122. Multiple fins can be formed using the method described above.

The insulation material deposited to form the STI regions may be an oxide, such as silicon oxide, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. An anneal process may be performed once the insulation material is formed. In some cases, the patterned hardmask used to etch the trenches to form fins may also be removed by the planarization process. The recess in the isolation region may be formed by a wet etch process or a dry etch process or a combination thereof. In some cases, the STI regions 122 include a fill material (not shown) and a liner (not shown), e.g., a liner oxide, interposed between the fill material and the substrate 110/semiconductor fins 120. The liner oxide (e.g., silicon oxide) may be a thermal oxide formed by, for example, a thermal oxidation of a surface layer of the substrate 110/semiconductor fins 120.

In this example the gate structure 170 of the FinFET 100 is formed using the gate last process flow. In a gate last process flow a sacrificial dummy gate structure (not shown) is formed after patterning the fins 120 and forming the STI regions 122. The dummy gate structure may comprise a dummy gate dielectric, a dummy gate fill, and a hardmask. To form the dummy gate structures, a dielectric material (e.g., silicon oxide, silicon nitride, multilayers thereof, or the like) is first formed either by deposition over the exposed surface of the fins 120 and the STI regions 122 using a method such as CVD, plasma-enhanced CVD (PECVD), atomic layer deposition (ALD) etc., or by thermal oxidation of the semiconductor surface, or combinations thereof. Next a dummy gate material (e.g., amorphous silicon or polycrystalline silicon) is deposited over the surface and then planarized by a suitable process, such as by CMP. A hardmask layer (e.g., silicon nitride or silicon carbide) may be formed over the planarized dummy gate material. The dummy gate structure is then formed by patterning the hardmask and then transferring that pattern to the dummy gate dielectric and dummy gate fill using suitable photolithography and etching techniques. The patterned dummy gate structures wrap around three sides of the protruding fins. The pattern of the dummy gate structures may be such that long continuous lines of dummy gate fill are shaped to wrap around the fins 120, extend between the fins 120 over the surface of the STI regions 122, and have a longitudinal direction that is substantially perpendicular to a longitudinal direction that of the respective fins 120.

Lightly doped drain (LDD) regions 125 in FIG. 1 are formed in the fins 120. The LDD regions 125 may be formed, e.g., by implanting n-type dopants for PMOS FinFET, or p-type dopants for NMOS FinFET, self-aligned to the dummy gate structure using an ion implantation process. After the LDD regions 125 are formed, gate spacers 130, illustrated in FIG. 1, are formed on sidewalls of the dummy gate structures and extend laterally onto the upper surface of the fins 120 and the STI regions 122. The spacer formation include deposition and anisotropic etch of a dielectric layer. The gate spacer material may include one or more dielectrics, such as silicon oxide, silicon nitride, silicon oxynitride, silicon carbide, silicon carbonitride, the like, or a combination thereof.

The more heavily doped source/drain regions 140 are subsequently formed self-aligned to the spacers 130. The source/drain regions 140 may be formed by first etching the fins to form recesses, and then depositing a crystalline semiconductor material in the recess by a selective epitaxial growth (SEG) process that may fill the recess and even extend beyond the original surface of the fin to form a raised source/drain structure, as in the example shown in FIG. 1. In some cases, the source/drain regions 140 may have facets or may have irregular shapes. The SEG process may use any suitable epitaxial growth method such as, vapor phase epitaxy (VPE), metal-organic CVD (MOCVD), molecular beam epitaxy (MBE), and liquid phase epitaxy (LPE). In some cases source/drain regions 140 may include alloys such as, silicon-carbon ($Si_{1-x}C_x$), silicon-carbon-phosphorous ($Si_{1-x-y}C_xP_y$), or the like in an n-channel FinFET, and silicon germanium ($Si_{1-x}Ge_x$) in a p-channel FinFET. In some cases, epitaxial source/drain regions 140 may be implanted with n-type dopants for NMOS devices and p-type dopants for PMOS devices using patterned photoresist masks. In some cases, the epitaxial source/drain regions 140 may be in situ doped during epitaxial growth.

Next, a contact etch stop layer (CESL) 150 of a suitable dielectric (e.g., silicon oxide, silicon nitride, or a multilayer combination thereof), followed by a first interlayer dielectric (ILD) 160 is formed over the structure. The first ILD 160 is formed to fill the space between dummy gates and the semiconductor fins with a dielectric such as silicon oxide, phosphosilicate glass (PSG), borosilicate glass (BSG), boron-doped phosphosilicate glass (BPSG), or the like. The dielectric layers used to form CESL 150 and first ILD 160 may be deposited by any suitable method, such as CVD, ALD, PECVD, sub-atmospheric CVD (SACVD), FCVD or spin-on. A planarization process, such as a CMP process, may be performed to remove excess first ILD material and any remaining hardmask material over the dummy gates to form a top surface where the top surface of the dummy gate fill material is exposed and is substantially coplanar within process variations with the first ILD 160.

Next, the gate replacement process is performed whereby the sacrificial dummy gate fill and dummy gate dielectric are first removed in one or more etching steps, and then replaced with an active gate and active gate dielectric. Removal of the dummy structure creates recesses between respective spacers 130. In each recess, a channel region along three sides of respective fins 120 is exposed. Each recess may be disposed between neighboring pairs of epitaxial source/drain regions 140 and LDD regions 125. Gate structures 170 are formed in the recesses and over the channel regions and comprise a gate dielectric layer 172 and one or more conductive layers 174, 176, and 178. In some embodiments the gate structure 170 may comprise a multilayered metal gate stack 174/176/178 formed over the gate dielectric layer 172. Gate dielectric layer 172, a barrier layer 174, and one or more work-function layers (illustrated in FIG. 1 as a work-function layer 176) are successively formed conformally in the recesses. The gate fill 178 fills the remainder of the recesses.

The gate dielectric layer 172 includes, e.g., a high-k dielectric material such as oxides and/or silicates of Hf, Al, Zr, La, Mg, Ba, Ti, and other metals, silicon nitride, silicon oxide, and the like, or combinations thereof. The barrier layer 174 may comprise one or more layers of a material such as TiN, TaN, Ti, Ta, combinations thereof, and the like. Exemplary work-function material of the work-function layer 176 include TiN, TaN, Ru, Mo, Al, WN, $ZrSi_2$, $MoSi_2$, $TaSi_2$, $NiSi_2$, WN for a p-channel FET, and Ti, Ag, TaAl, TaAlC, TiAlN, TaC, TaCN, TaSiN, Mn, Zr for an n-channel FET. Other suitable materials or combinations thereof may be used and their thicknesses chosen to tune the workfunction to achieve a target threshold voltage for the respective FinFET. The gate fill 178 may be made of a conductive material such as Cu, Al, W, TiN, TaN, TaC, Co, Ru, the like, combinations thereof, or multi-layers thereof. The materials used in forming the gate structure may be deposited by any suitable method, e.g., CVD, physical vapor deposition (PVD), ALD, electrochemical plating (ECP), electroless plating and the like.

After the formation of the gate fill 178, a planarization process, such as a CMP, may be performed to remove the excess portions of the replacement gate layers 172, 174, 176, and 178 from over the top surface of the first ILD 160. The resulting structure includes the exposed top of the first ILD layer 160, the CESL 150, the spacers 130, and the remaining portions of the replacement gate layers (e.g., layers 172, 174, 176, and 178) having substantially coplanar surfaces.

The cross-section of FinFET device 100 along a longitudinal axis through the center of a fin, shown in FIG. 1, illustrates its structure. The schematics of the various regions are for illustration purposes only and are not meant to be limiting.

The gate structure 170 is shown in FIG. 1 as it extends over the top of fin 120. The replacement gate and the FinFET channel along the vertical sides of the fin do not appear in the plane of this cross-section. The channel current may be designed to flow substantially horizontally along the vertical sides of the fins by keeping the fin width small relative to its height. FinFETs designed in this manner have the advantage of being able to conduct high current within a compact planar footprint. Another advantage of circuit blocks built using FinFETs over those using planar FETs is lower power consumption at the same operating speed. Because of these advantages the use of FinFETs is becoming more widespread. There is thus a need for improved methods to form compact low resistance contacts to FinFETs to maintain its high current conduction capability simultaneously with its small planar footprint.

An electronic component of an integrated circuit (IC), e.g. FinFET 100, may be connected to other circuit components, signal lines, and power supply lines in accordance with a circuit design to form functional circuits. Many of these connections are achieved using a multilevel interconnect system of conductive interconnect structures comprising lines, contacts, and vias formed in dielectric layers above the substrate 110. In general, an interconnect level includes a dielectric layer comprising one or more dielectric materials, and conductive structures therein. Conductive structures that may generally conduct electrical current substantially horizontally are referred to as lines and those that may conduct electrical current substantially vertically are referred to as interlevel connectors (e.g., contacts and vias). Electrically isolated dummy conductive structures may also be formed to reduce geometrical pattern nonuniformity. Enhancing pattern uniformity often facilitates the fabrication process by enlarging the process window of critical photolithography, etching, and CMP process steps.

A dielectric layer of the interconnect system disposed immediately above the substrate 110 may be referred to as an interlayer dielectric (ILD). The ILD may comprise one or more dielectric layers. Lines and interlevel connectors that are formed in the ILD may be referred to as metal-zero ($M_0$) lines and contacts, respectively. Other interconnect dielectric layers disposed above the ILD may be referred to as an intermetal dielectric (IMD). An IMD may comprise one or more dielectric layers. Other interconnect connectors disposed above contacts may be referred to as vias. Contacts may make electrical contact to electrodes of an electronic component formed in the substrate 110, e.g., FinFET 100. Thus a contact may serve as part of an electrical connection between an electronic component formed in the substrate 110 and a vertically adjacent interconnect conductive structure, e.g., a line. Generally, the conductive interconnect structure that a contact connects to is a line but, in some embodiments, it may be another contact or via.

A conductive line at any particular level above the contact level is separated from other conductive lines by one or more IMD levels. A pair of conductive lines at different levels vertically adjacent to each other may be electrically connected by one or more vias formed in the IMD interposed between the two interconnect levels. For example, a line at the $n^{th}$ metallization level ($M_n$) may be connected to another line at the $(n+1)^{th}$ metallization level ($M_{n+1}$) by one or more vias. Thus, a via may serve as a conductive path via which electrical current can flow vertically between two adjacent levels. A via may also be used to establish other connections, e.g., connect a contact to a conductive line disposed vertically above the via, connect an electrode of a device formed above the surface to a conductive line vertically adjacent to the electronic device, etc.

An electrical connection between a pair of lines at nonadjacent interconnect levels or between an electronic component formed in the substrate and a nonadjacent upper-level line may be achieved by using a stacked via configuration (or a stack of contacts and vias). For example, the drain electrode of FinFET 100 may be connected to an inductor designed using a spiral line at the third metal level ($M_3$) by using a vertical stack comprising a contact, a first level metal line ($M_1$), a via at the first via level ($V_1$), a second level metal line ($M_2$), and a via at the second via level ($V_2$). In this stack the $M_1$ and $M_2$ lines serve as landing pads for the respective interlevel connectors and may conduct electrical current predominantly in the vertical direction.

Other interlevel connectors may be used to connect to electrodes of components formed above the substrate, such as, MIM capacitors, thin-film resistors, inductors, MEMS components e.g., digital mirror devices, infrared bolometer arrays, inkjet printheads, etc., and the like.

A method of forming contacts through an ILD layer to a device (e.g., a transistor) in accordance with some embodiments is described below with reference to FIGS. 2A through 2G. These figures illustrate cross-sectional views of the contact structures during various stages of their formation in the context of connecting the source/drain and gate electrodes of FinFET 100 to conductive features of the first interconnect level above the contact level and ILD. Other embodiments may be utilized in other levels, such as within the metallization layers.

Figure 2A:
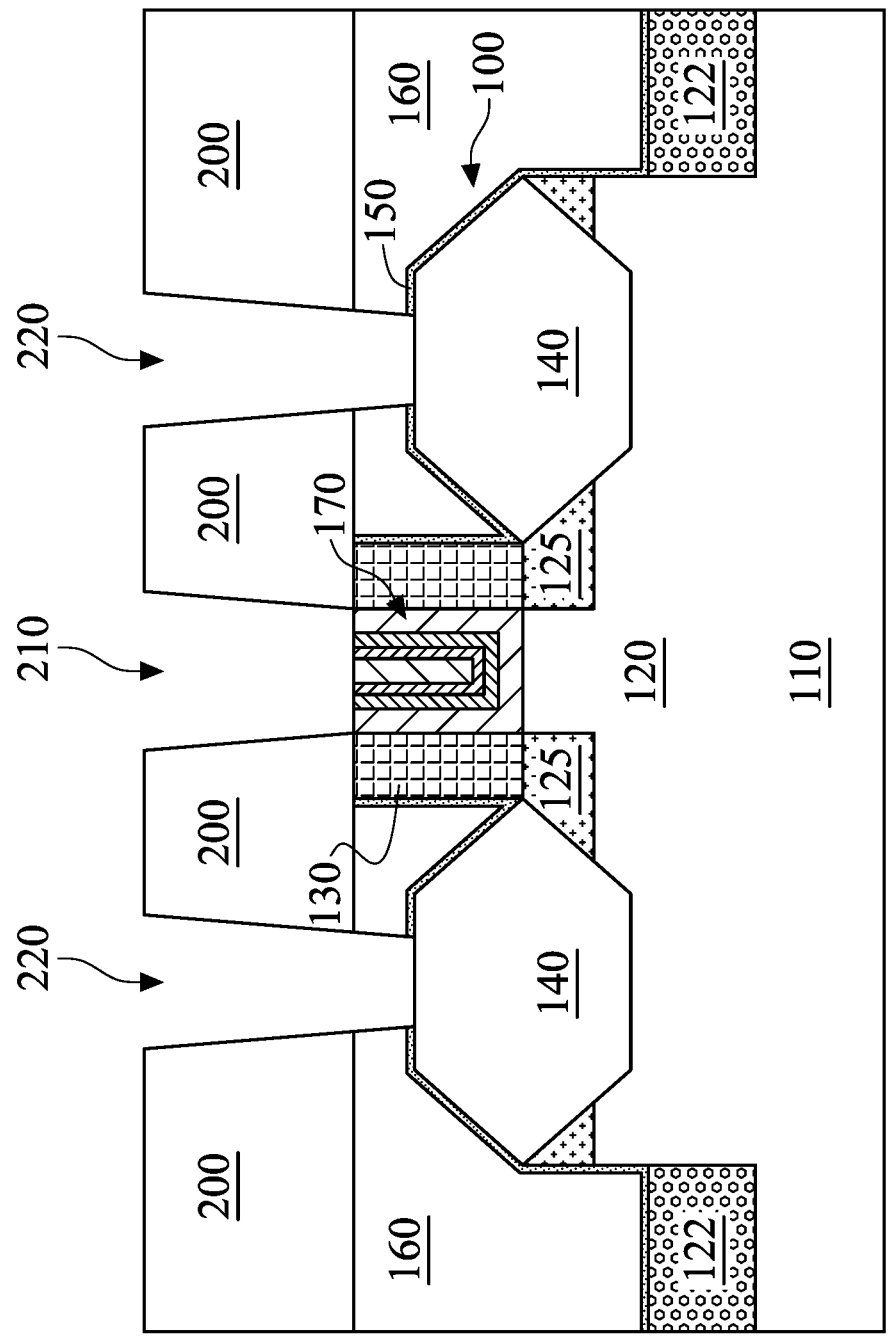
FIGS. 2A through 2G illustrate cross-sectional views at various stages of forming conductive interconnect structures that contact electrodes of a FinFET in accordance with some embodiments.

Referring first to FIG. 2A and starting from the structure in FIG. 1, a second ILD 200 may be deposited over the first ILD 160. The second ILD 200 may be formed of a dielectric material such as PSG, BSG, BPSG, undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, and may be deposited by any suitable method, such as CVD, HDP-CVD, SACVD, PECVD, FCVD, and spin-on.

Contact openings 210 and 220 are formed extending through the second ILD 200, as illustrated in FIG. 2A. Openings 210 and 220 are formed by etching ILD layers 160 and/or 200 using a patterned photoresist mask and/or hardmask using suitable photolithography and etching techniques. For example, the contact opening 210 is formed through the second ILD 200 and the CESL 150 to exposes the gate structure 170; while contact openings 220 are formed through the second ILD 200, the first ILD 160, and the CESL 150 to expose the source/drain regions 140. The etch chemistry used to remove the materials of the first ILD 160 and the second ILD 200 is generally sufficiently selective to the materials used in the gate structure 170 and the CESL 150. The etchants may be then switched to selectively remove CESL 150 and expose source/drain regions 140 and the gate structure 170. Typically, a sufficiently long CESL over-etch time is used to ensure good contact between the subsequently formed contact plugs and the source/drain regions 140. Generally, contact openings for contacts to the gate structure 170 (e.g., opening 210 for a contact to gate structure 170), and contact openings for contacts to the source/drain regions (e.g., openings 220 for contacts to source/drain regions 140) are formed staggered relative to each other, such that the openings 220 and the opening 210 would not appear in the same cross-section as depicted in FIG. 2A. However, they are shown in a single cross-section in this disclosure in order to illustrate the states of both types of contacts simultaneously during each stage of the contact formation process. Additionally, the openings 220 and the opening 210 may be formed in a simultaneously or individually. For example, the openings 220 may be formed while the area over the gate structure 170 is protected, and then the openings 220 may be protected while the opening 210 is formed over the gate structure.

Figure 2B:
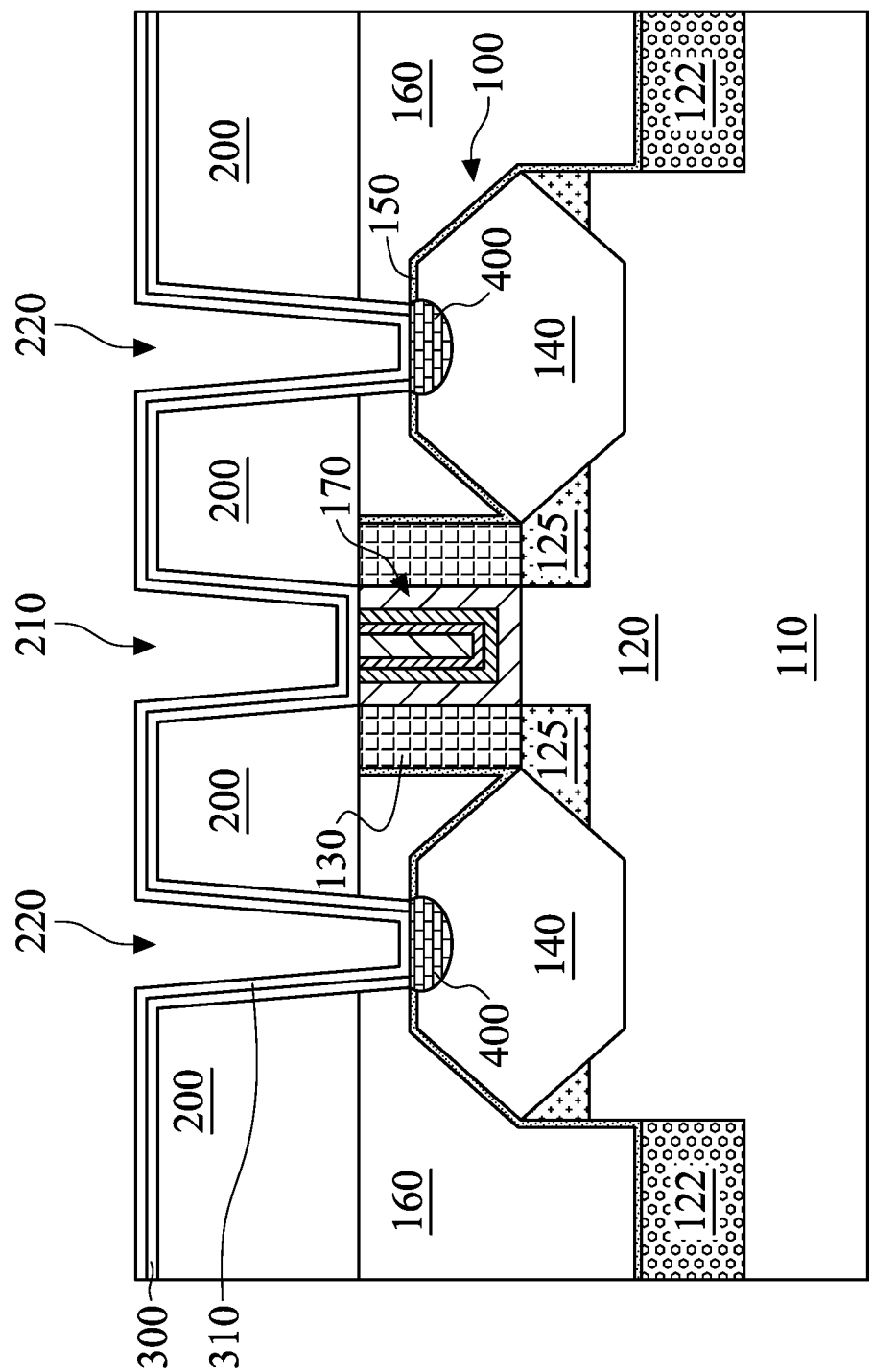

Referring now to FIG. 2B, a first metal layer 300, a second metal layer 310, and a silicide region 400 are formed in accordance with some embodiments. In some embodiments a pre-clean process to remove a native oxide may be performed prior to depositing the first metal layer 300. The silicide region 400 may be formed to provide a low contact resistance ohmic contact between a subsequently formed contact and the semiconductor material of the source/drain regions 140. The surface of the silicide region 400 in FIG. 2B (and subsequent figures) is shown to be protruding above the surface of the source/drain region 140 for illustrative purposes. In other embodiments, the silicide region may be coplanar, protruding above, or recessed below the adjacent semiconductor surface of the source/drain region 140. The silicide region 400 may comprise a metal silicide (e.g., $TiSi_2$, NiSi, PtSi, and $CoSi_2$ etc.) through which electrical current would flow between the semiconductor of the source/drain regions 140 and the conductive material used to form contacts in subsequent processes. For example, in some embodiments, $TiSi_2$ is formed at the surface of the source/drain regions 140 exposed inside openings 220. The $TiSi_2$ may be formed, for example, by depositing Ti as the first metal layer 300 and TiN over the Ti layer as the second metal layer 310, wherein the Ti of the first metal layer 300 contacts the source/drain regions 140 inside openings 220. In some embodiments, thicknesses of the Ti layer and TiN layer are 2 nm to 10 nm and 5 nm to 15 nm, respectively. Generally, the first metal layer 300 and the second metal layer 310 cover the surface of the openings completely. After deposition of the first metal layer 300 and the second metal layer 310, an anneal step may be performed to cause the Ti of the first metal layer 300 to react with the material of the source/drain regions 140 to form a silicide region 400 as illustrated in FIG. 2B. The thermal cycle of this anneal step can be adjusted to completely convert the Ti of the first metal layer 300 in contact with the semiconductor. For example, the Ti of the first metal layer 300 in contact with the $Si_{1-x}Ge_x$ alloy semiconductor in the source/drain region of a PMOS device, or elemental Si in the source/drain region of an NMOS device, may be completely converted to form respective silicide regions 400 of metallic silicides of titanium.

Figure 2C:
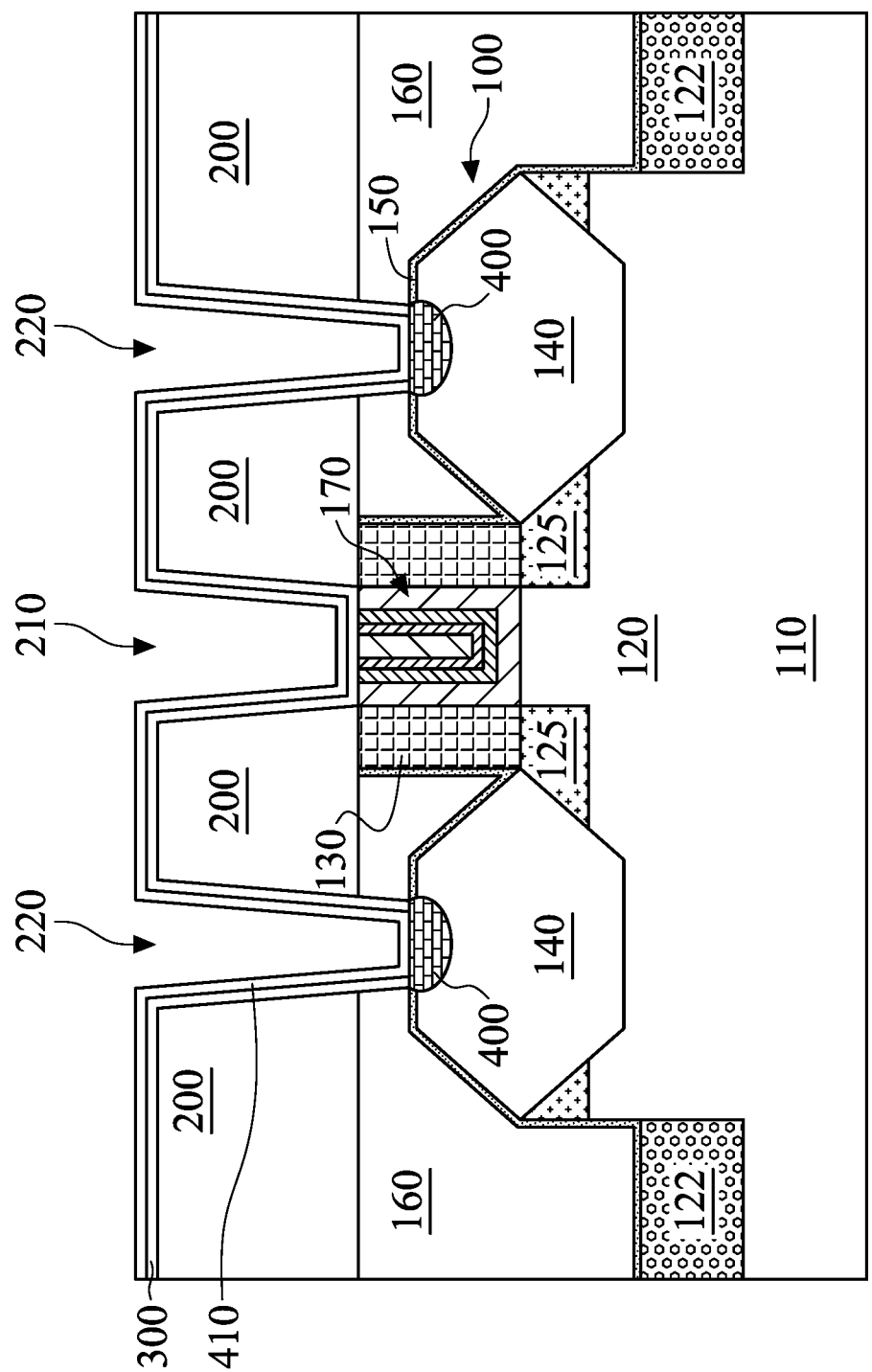

FIG. 2C illustrates replacement of the second metal layer 310 (see FIG. 2B) with a third metal layer 410 in accordance with some embodiments. In some embodiments, the second metal layer 310 is removed by a pull-back process that may include a suitable wet chemical etch (e.g., an RCA-1 treatment using 1:1:5 $NH_4OH:H_2O_2$:deionized water solution). Thereafter, the third metal layer 410 may be formed to provide an adhesion/barrier layer for the subsequent fill material. The barrier layer prevents or reduces out-diffusion of the conductive fill material subsequently deposited to form contact plugs. In some embodiments, the third metal layer 410 comprises a TiN layer of a thickness of 1 nm to 15 nm. TiN layer may be formed using any suitable deposition technique such as, CVD, PVD, magnetron RF/DC co-sputtering (RFDC PVD), ALD, direct nitridation of Ti, and/or the like. The third metal layer 410 may contain other materials, e.g., Ti and Co. It could also serve multiple purposes, e.g., serve as an endpoint etch stop layer for a subsequent CMP process or reactive ion etch (RIE) process.

FIG. 2B illustrates the first metal layer 300 and the second metal layer 310, and FIG. 2C illustrates the first metal layer 300 and the third metal layer 410 (formed after the pull-back process) lining the entire surface of the sidewalls of the openings 210 and 220 and the entire upper surface of the second ILD 200, in accordance with some embodiments. Other embodiments may have different configurations. For example, in some embodiments, the first metal layer 300 and the second metal layer 310 may be completely removed after forming the silicide region 400. In other embodiments, the first metal layer 300 and the second metal layer 310 may be partially recessed into the openings 210 and 220, after which the third metal layer 410 is formed. In yet other embodiments, the second metal layer 310 may be removed and the first metal layer 300 may be partially recessed within the openings 210/220, after which the third metal layer 410 is formed. Other embodiments may utilize other configurations.

Figure 2D:
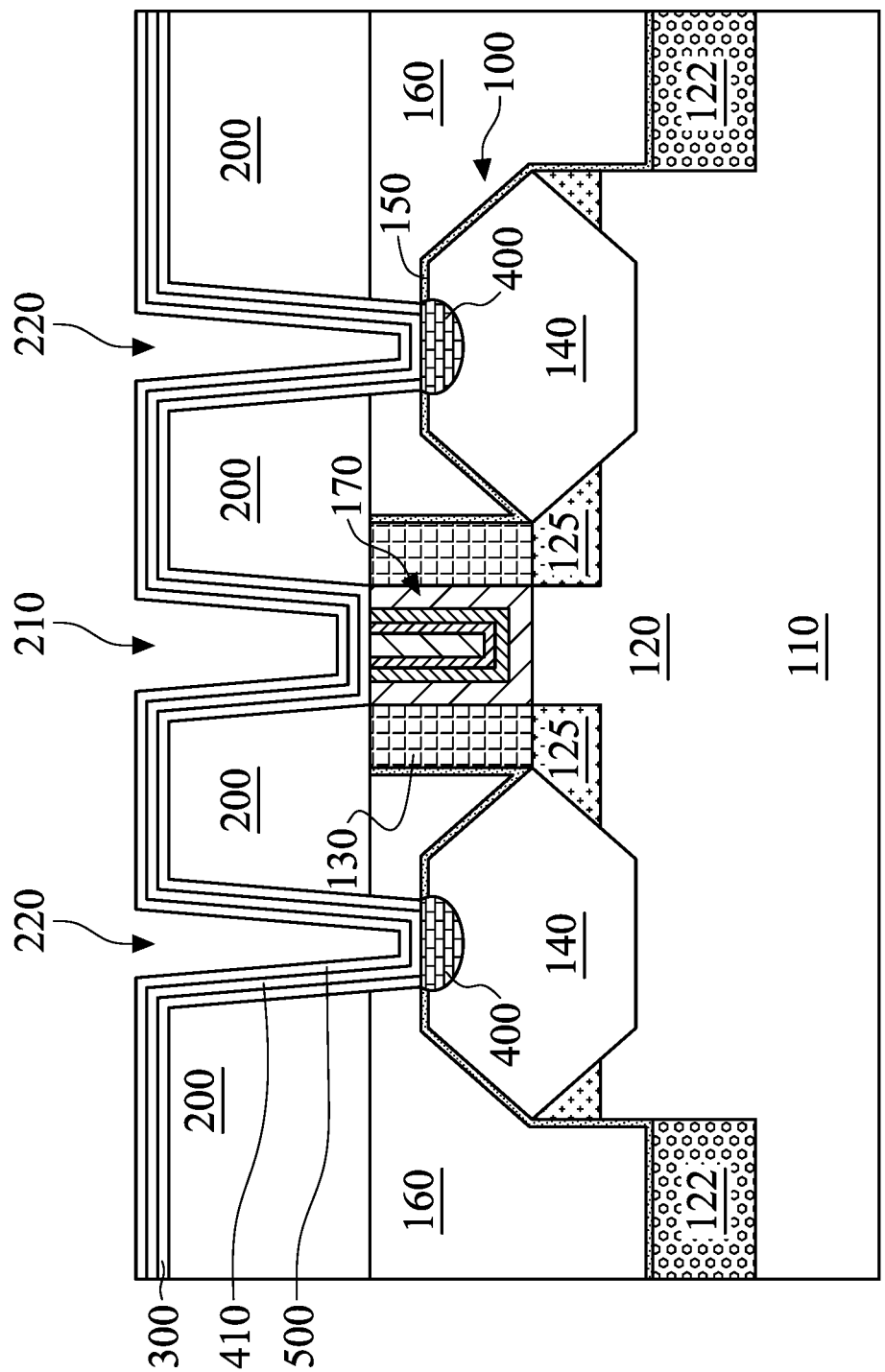

Referring now to FIG. 2D, a seed layer 500 is deposited over the third metal layer 410. In some embodiments in which the bulk of the conductive material used to fill the contact openings and form contact plugs include the metal Co, the seed layer 500 may include a Co seed layer. The Co seed layer 500 may have a thickness of, for example, 5 nm to 50 nm and may be formed using a suitable deposition technique such as, CVD, PVD, ALD and the like. In some embodiments, the Co seed layer 500 is a conformal layer. The as-deposited third metal layer 410 and the Co seed layer 500 may be disposed as a continuous liner on the surface of the wafer, and along the sidewalls and at the bottom surface of the openings 210 and 220, as illustrated in FIG. 2D. The second TiN layer 410 can effectively block diffusion of Co into the substrate 110 or the ILD 160/200.

Figure 2E:
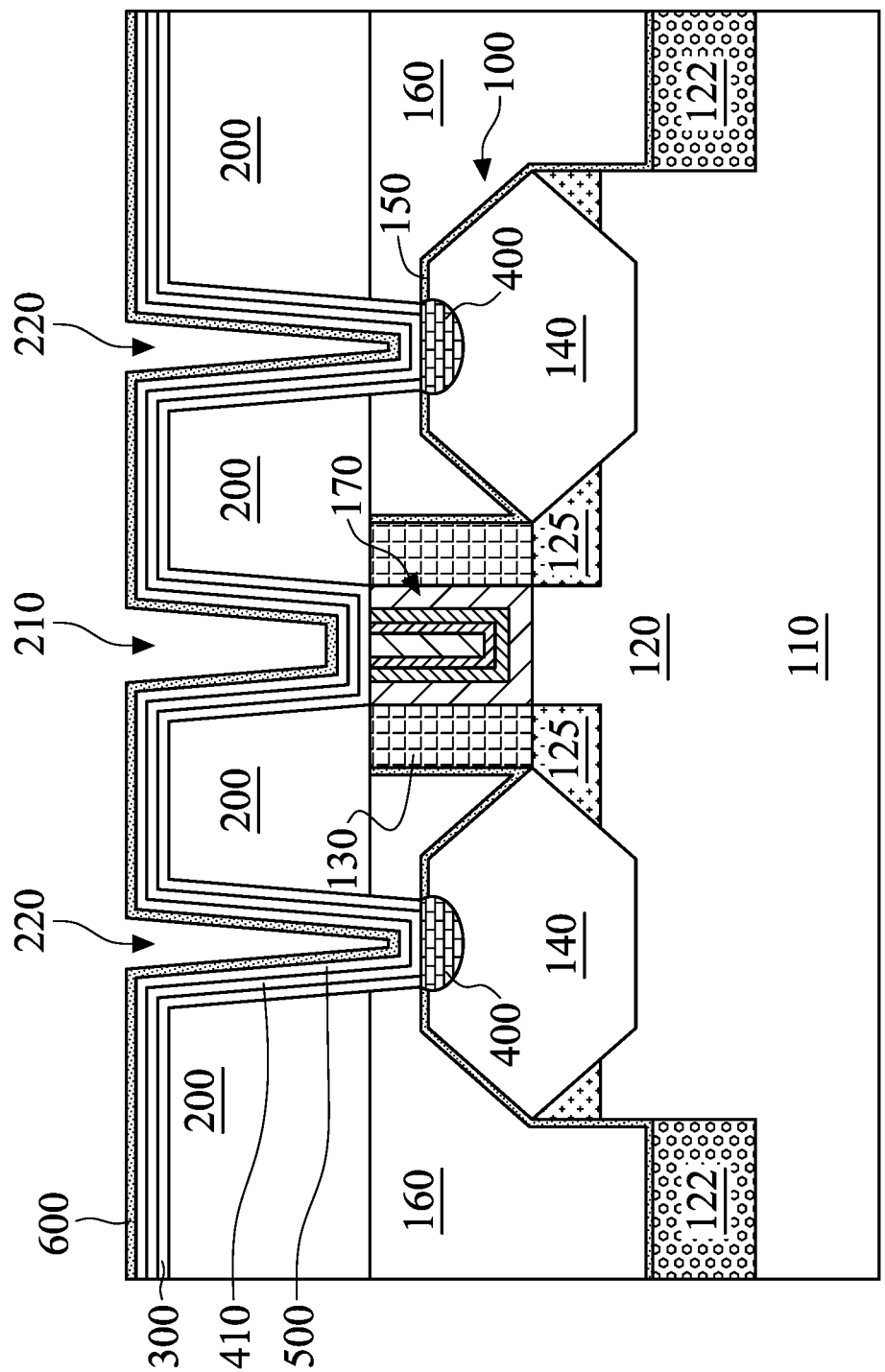

As illustrated in FIG. 2E, after the deposition of seed layer 500 is complete the seed layer may be exposed to an ambient containing oxygen (e.g., air) and react with oxygen to form a thin oxide layer 600 of a few monolayers of a metal oxide, such as cobalt oxide (CoO), having a thickness of about 1 nm to about 10 nm. The presence of this metal oxide layer 600 is likely to reduce the performance characteristics of the contact. As explained in greater detail below, one or more physical and/or chemical surface treatments such as, a reactive remote plasma surface treatment process in a cluster tool with a vacuum pre-treatment module (VPM), and/or an in situ wet surface treatment process may be performed to substantially reduce or remove the oxide layer 600 over the seed layer 500. In these and other embodiments described in this disclosure, the surface treatment processes are in situ processes wherein once the oxide layer 600 is reduced or removed using a surface treatment of the seed layer 500, the cleaned surface may not be exposed to an ambient containing oxygen (e.g., air) before a conductive fill layer 700 (illustrated in FIG. 2F), is deposited over the seed layer 500.

In some embodiments, a reactive remote plasma surface treatment process in a cluster tool may be used to substantially reduce or remove the oxide layer 600 on the surface of the wafer placed in oxygen-free ambient inside a vacuum chamber. An example of a reactive plasma surface treatment process in a cluster tool is described here. In this example, the seed layer 500 comprises Co and the oxide layer 600 comprises CoO. The active species are reducing agents (e.g., hydrogen radicals H*) generated in a remote plasma chamber. The plasma may be generated using, for example, a carrier gas (e.g., Ar, $N_2$) at a flow rate of about 10 sccm to about 10,000 sccm, a process gas (e.g., $H_2$, $NH_3$, or the like) at a flow rate of about 3 sccm to about 15 sccm, at a pressure of about 50 mTorr to about 1000 mTorr, a temperature of about 50° C. to about 300° C., and a stabilization time of about 1 second to about 300 seconds. An RF power of about 1 kW to about 6 kW at an excitation frequency of about 13 MHz to about 40 MHz may be used to generate hydrogen radicals. The hydrogen radicals generated in the remote plasma discussed above are directed from the remote plasma chamber to the wafer where the hydrogen radicals react with CoO present on the surface. An example of such a reaction is described by the chemical equation $CoO+2H^* \rightarrow Co+H_2O$ (g) at a pressure of about 10 mTorr to about 500 mTorr and a temperature of about 30° C. to about 500° C. for a time period of about 10 seconds to about 50 seconds to reduce the CoO to Co and produce a byproduct of $H_2O$ in the form of steam. The process conditions may be varied dependent upon the materials and the conditions. For example, if a thicker oxide layer 600 is present, then it may be desirable to perform the process for a longer period of time. Other chemicals and chemical reactions may also be used for substantial reduction/removal of the surface oxide layer 600.

In addition to substantial reduction/removal of metal oxide from the surface (e.g., CoO present in the oxide layer 600), the reactive remote plasma surface treatment process in a cluster tool leaves the surface smoother and hydrophilic (e.g., film contact angle is less than 30 degrees). A smooth hydrophilic surface helps in distributing the electrolyte chemicals uniformly on the substrate during the subsequent electroplating step. This can improve coverage of metal (e.g., cobalt) deposition in the sidewall regions of the contact openings 210 and 220. Typically, better than 90% coverage of Co is achievable in manufacturing.

Once the reactive remote plasma surface treatment process is completed, the wafer may be transferred within the cluster tool to the chamber where the conductive fill layer 700 (illustrated in FIG. 2F) may be deposited over the seed layer 500 during a subsequent processing step. The equipment used to perform the reactive remote plasma surface treatment and the equipment used to deposit the conductive fill layer 700 may be integrated into the same cluster tool. Thereby, the reactive plasma clean may be performed in situ without exposing the cleaned surface to ambient containing oxygen (e.g., air) during the time the wafer is transferred to the equipment used for depositing the conductive fill layer 700 (e.g., a Co fill layer). The conductive fill layer 700 may have a thickness from about 4 nm to about 400 nm, and may be deposited using, for example, an electrochemical plating (ECP) process, a DC PVD Co process, a RFDC PVD Co process, or the like.

In some embodiments, an in situ wet surface treatment process may be used to substantially reduce or remove the oxide layer 600 on the surface of the wafer. In some embodiments in which an ECP process is used to deposit a conductive fill layer 700 (illustrated in FIG. 2F) over the seed layer 500, the in situ wet surface treatment process may comprise soaking the wafer in the electrolyte bath while the electrolysis cell is held in an open circuit state by disconnecting the electroplating current for an initial soak time before initiating the ECP deposition of the conductive fill material. The oxide layer 600 may be substantially reduced or removed by an in-situ chemical reaction with the electrolyte solution. After the wet surface treatment is completed, the ECP deposition of the conductive fill layer 700 (illustrated in FIG. 2F) may be performed by enabling the electroplating current.

An example of an in-situ wet surface treatment process in an embodiment in which the seed layer 500 comprises Co and the oxide layer 600 comprises CoO, is described here. Electroplating or ECP is an electrochemical process whereby a metal coating is deposited on a metallic surface by electrolysis. ECP involves immersing a pair of metallic electrodes in an electrolyte bath containing a conductive solution which collectively constitute an electrolysis cell. The surface on which the metal is to be deposited (e.g., the Co-seed layer 500) is generally biased as the cathode and the source of the material to be deposited (e.g., the working electrode) is generally the anode. Passing electrical current through the electrolysis cell causes the metal atoms to lose electrons (oxidation process) at the anode to form metal cations that dissolve into the solution while, at the same time, metal cations present in the electrolyte gain electrons (reduction process) at the cathode to get deposited on the cathode as metal atoms. In this manner material is corroded from the anode and deposited on the cathode. In some ECP processes the deposited metal may not be coming from the anode. Instead, the metallic ions may be added to the electrolyte from a separate source. The total deposition rate is proportional to the electroplating current flowing through the electrolysis cell (Faraday's law of electrolysis). Organic chemical additives, referred to as suppressors, levelers, and accelerators, may be used to control the deposition rate according to the topography of the surface being plated. For example, the deposition rate on sidewalls may be suppressed to achieve a predominantly bottom-fill ECP process.

In an embodiment, the in-situ wet surface treatment process is performed by first immersing the wafer in the electrolyte bath when the electrolysis cell is in an open circuit state. One example of an electrolyte solution suitable for ECP deposition of Co may comprise about 99% cobalt sulfate ($CoSO_4.7H_2O$) and about 1% dilute sulfuric acid, as well as small quantities of chemical additives that include, for example, a Co suppressor, such as an amine group, or polyethyleneimine, or the like. The electroplating current continues to be held at zero amperes for a soak time period prior to applying a current to begin the electroplating process, thereby exposing the oxide layer 600 to the electrolyte solution. During the soak time, the acid in the electrolyte may react with the CoO exposed on the surface as described by the chemical equation $2H^*+CoO \rightarrow Co+H_2O$ (g), thereby dissolving away the cobalt oxide on the surface. Soaking the substrate in the electrolyte bath may substantially reduce or remove the oxide layer 600. In some embodiments, the substrate may be soaked in the electrolyte bath at a temperature of about 15° C. to about 30° C. with the electroplating current held at zero amperes for a time period ranging from about 0.75 second to 100 seconds.

An open circuit potential (OCP) may be monitored during the time the wafer is immersed in the electrolyte and the electroplating current is zero. OCP refers to the difference that exists in electrical potential between the anode and a Pt reference electrode in contact with the electrolyte. A high value of the measured OCP indicates that there may be excessive cobalt oxide remaining on the surface. In some embodiments, the soak time may be selected such that the OCP reduces to less than 0.1 volt before the electroplating current is turned on.

Figure 2F:
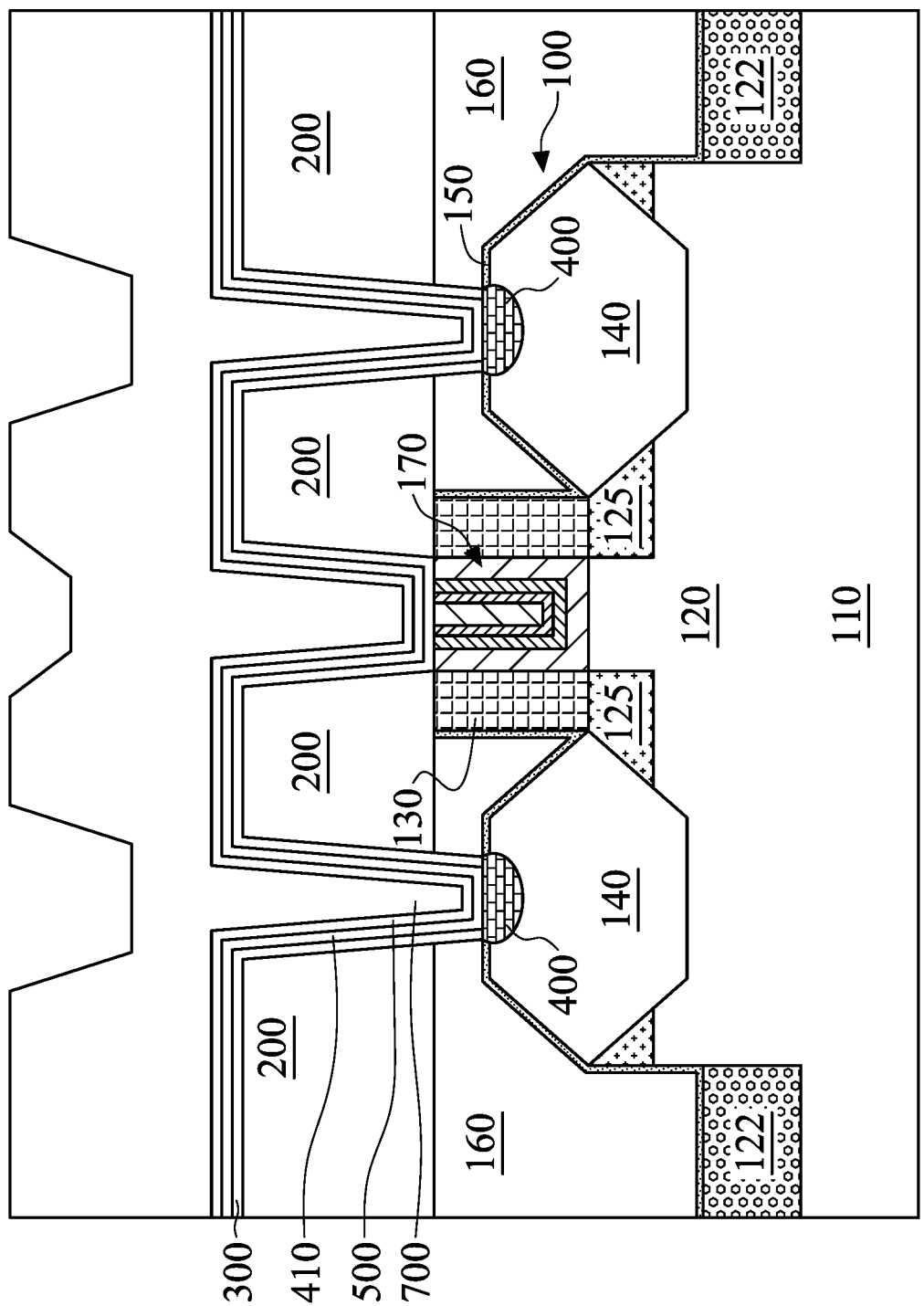

In some embodiments, the ECP process may be performed with a pump flow rate of about 3 liter/min to about 15 liter/min, a plating speed from about 5 rpm to about 175 rpm, a plating gap of about 1 mm to about 3 mm, and an electroplating current of about 0.17 ampere to about 8 ampere may be used for an electroplating time from about 0.1 second to about 1,000 seconds. An example waveform or plot of electroplating current vs. time for some embodiment incorporating an in-situ wet surface treatment process using the electrolyte bath of an electrolysis cell held in an open circuit state is illustrated in FIG. 2H. An initial soak time period of 1.75 seconds is illustrated. During this time the electroplating current is zero. After the soak time period elapses, the current is set at 0.17 ampere and ramped up to 0.69 ampere over a period of 240 seconds. After this ramping period, the current is set at 1.38 amperes for a period of 60 seconds, after which the current is set at 5.52 amperes for a period of 145 seconds to complete the electroplating process.

In some embodiments, a combination of the processes discussed above may be utilized. For example, the oxide layer 600 may be initially substantially reduced and/or removed utilizing the in situ reactive remote plasma surface treatment process discussed above, after which remaining portions of oxide layer 600 (if any) may be reduced and/or removed in the electroplating solution during the in-situ wet surface treatment process step discussed above prior to turning on the electroplating current to begin deposition of Co using the ECP process technique. Other embodiments may include the in situ reactive plasma surface treatment process but omit the in-situ wet surface treatment process step wherein the wafer is soaked in the electrolyte bath of an electrolysis cell held in an open circuit state.

The in situ wet surface treatment process may be performed in an electrolysis cell in a vacuum chamber where the pressure is from about 1 mTorr to about 1000 mTorr.

In some embodiments, other pre-treatment processes may be used instead of or in combination with the reactive remote plasma and the in situ wet surface treatment processes described above. For example, in some embodiments, an active pre-clean (APC) process, or a Metal Clean xT (MCxT) process using a Metal Clean version xT tool may be utilized.

The APC process may reduce or remove the oxide layer 600 by chemically reacting the oxide layer 600 with hydrogen radicals. The APC process may use a carrier gas (e.g., Ar, and/or $H_2O$) at a flow rate of about 10 sccm to about 10,000 sccm, a process gas (e.g., pure $H_2$, or 1% to 99% dilute $H_2$ in a mixture of $H_2$ and air) at a flow rate of about 10 sccm to about 3000 sccm, at a pressure of about $8\times10^{-6}$ mTorr to about 900 Torr, a temperature of about 25° C. to about 100° C., and an RF power of about 5 W to about 7 kW at an excitation frequency of about 13 MHz to about 40 MHz. The wafer may be exposed (e.g., to the H*) in the APC tool for a time of about 1 seconds to about 1000 seconds.

The MCxT process may reduce or remove a portion of the oxide layer 600 by using sputter etching with energetic ions (e.g., Ar ions at energies of about 0.01 keV to about 10 keV). The MCxT process may use a process gas (e.g., Ar, $H_2$, $N_2$, or a $H_2/N_2$ mixture) at a flow rate of about 10 sccm to about 1000 sccm, at a pressure of about 1 mTorr to about 1000 mTorr, a temperature of about 25° C. to about 100° C., an RF power of about 10 W to about 500 W at an excitation frequency of about 13 MHz to about 40 MHz, and a DC bias of about 0.5 kV to about 40 kV. The wafer may be exposed to energetic ions (e.g., to the Ar ions) in the MCxT tool for a time of about 2 seconds to about 200 seconds FIG. 2F illustrates the structure after removing the oxide layer 600 and completing the deposition process to form a fill layer 700. As illustrated in FIG. 2F, the deposited thickness of fill layer 700 (Co in this example) may range from 4 nm to 400 nm such that the fill layer 700 completely fills the openings 210 and 220. After deposition of Co-fill layer 700, an edge bevel removal process may be performed using chemical sprays (e.g., $H_2O_2$, $H_2SO_4$ etc.) over a cleaning range of about 2.0 mm to about 4.5 mm from the edge of the wafer. In some embodiments, a post-deposition anneal may be done at a temperature from about 25° C. to about 400° C. In an embodiment where the fill layer 700 comprises Co, the resistivity may be less than 20μΩ.

Figure 2G:
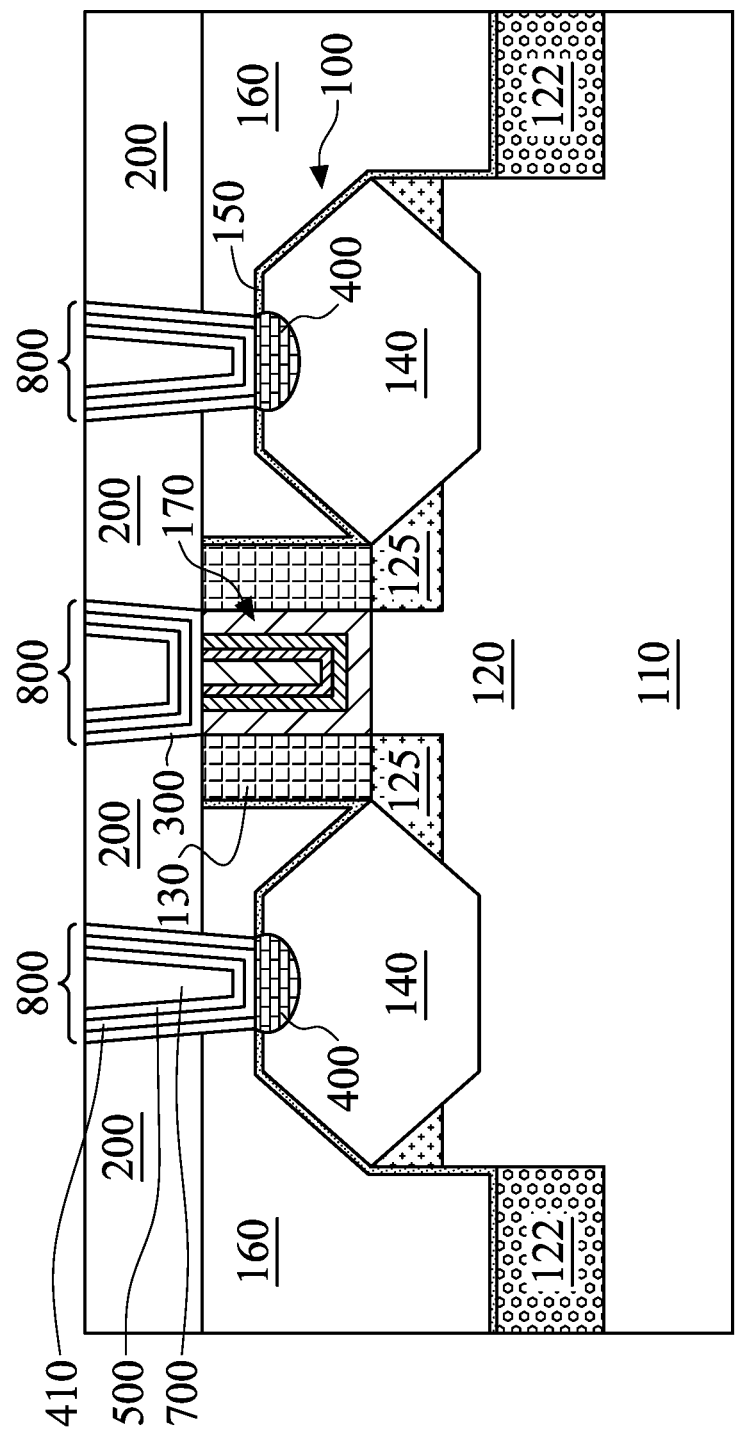
Figure 2H:
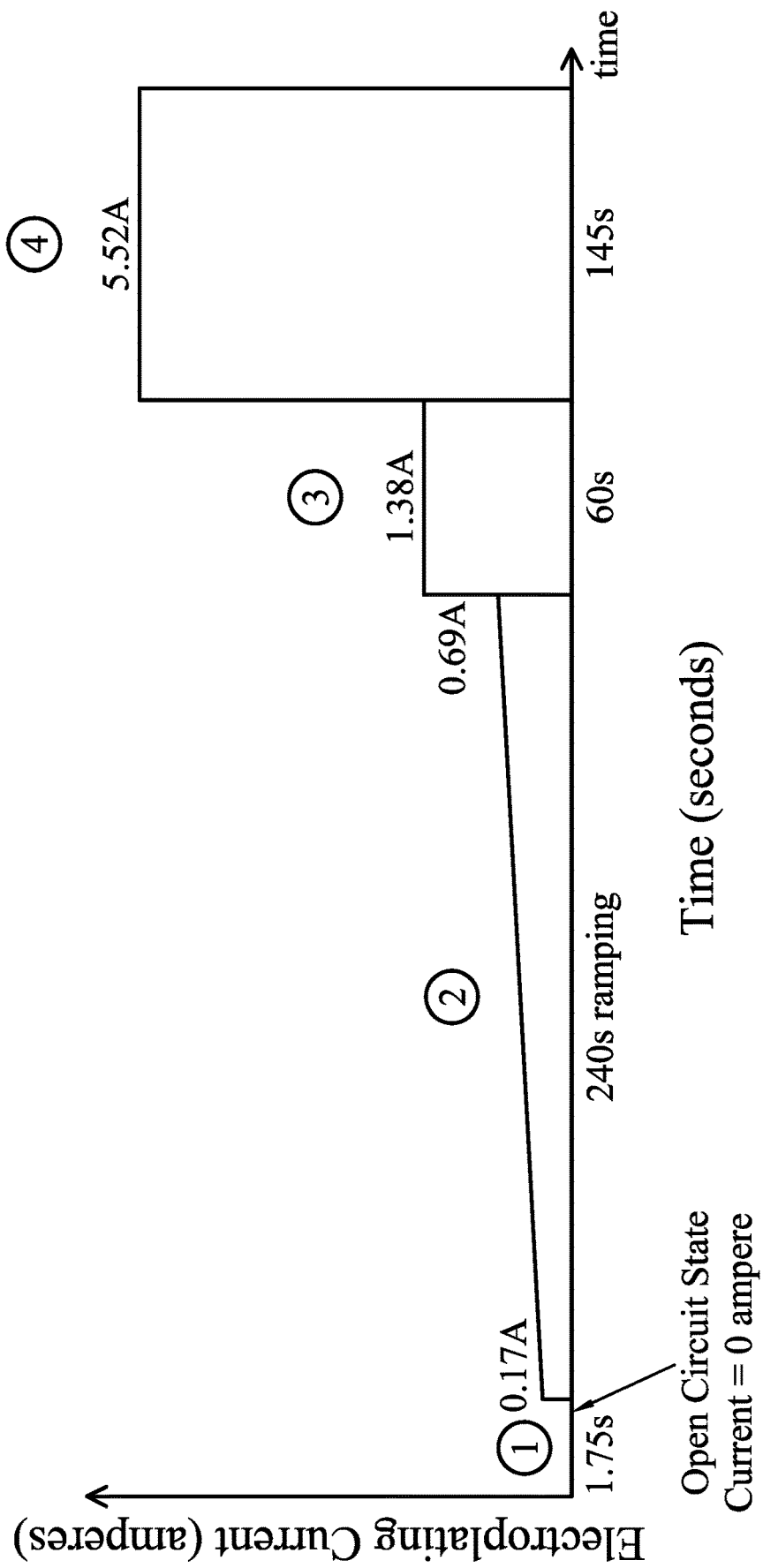
FIG. 2H illustrates an exemplary electroplating current waveform for an electrochemical plating process step to deposit a conductive fill material illustrated in FIG. 2F during the forming of conductive interlevel structures in accordance with some embodiments.

Next, as illustrated in FIG. 2G, a suitable planarization technique such as CMP may be used to remove excess materials from the upper surfaces of the second ILD 200, thereby exposing a top surface of ILD 200. The conductive materials confined inside openings 210 and 220 are collectively referred to as contact plugs 800 as illustrated in FIG. 2G.

The rest of the multilevel interconnect system may then be formed in accordance with a back end of line (BEOL) scheme adopted for the integrated circuit design technology platform. One or more interconnect levels may be formed above the contact plugs 800 formed in the ILD. As discussed above, each of these interconnect levels comprise conductive lines and vias formed in the respective IMD layers. Vias generally connect lines at one level to lines at the next vertically adjacent level. Conventionally, the numbering scheme used is: lines $M_1$ are connected to lines $M_2$ by vias $V_1$ formed below $M_2$, lines $M_2$ are connected to lines $M_3$ by vias $V_2$ formed below $M_3$ and so on.

Figure 3A:
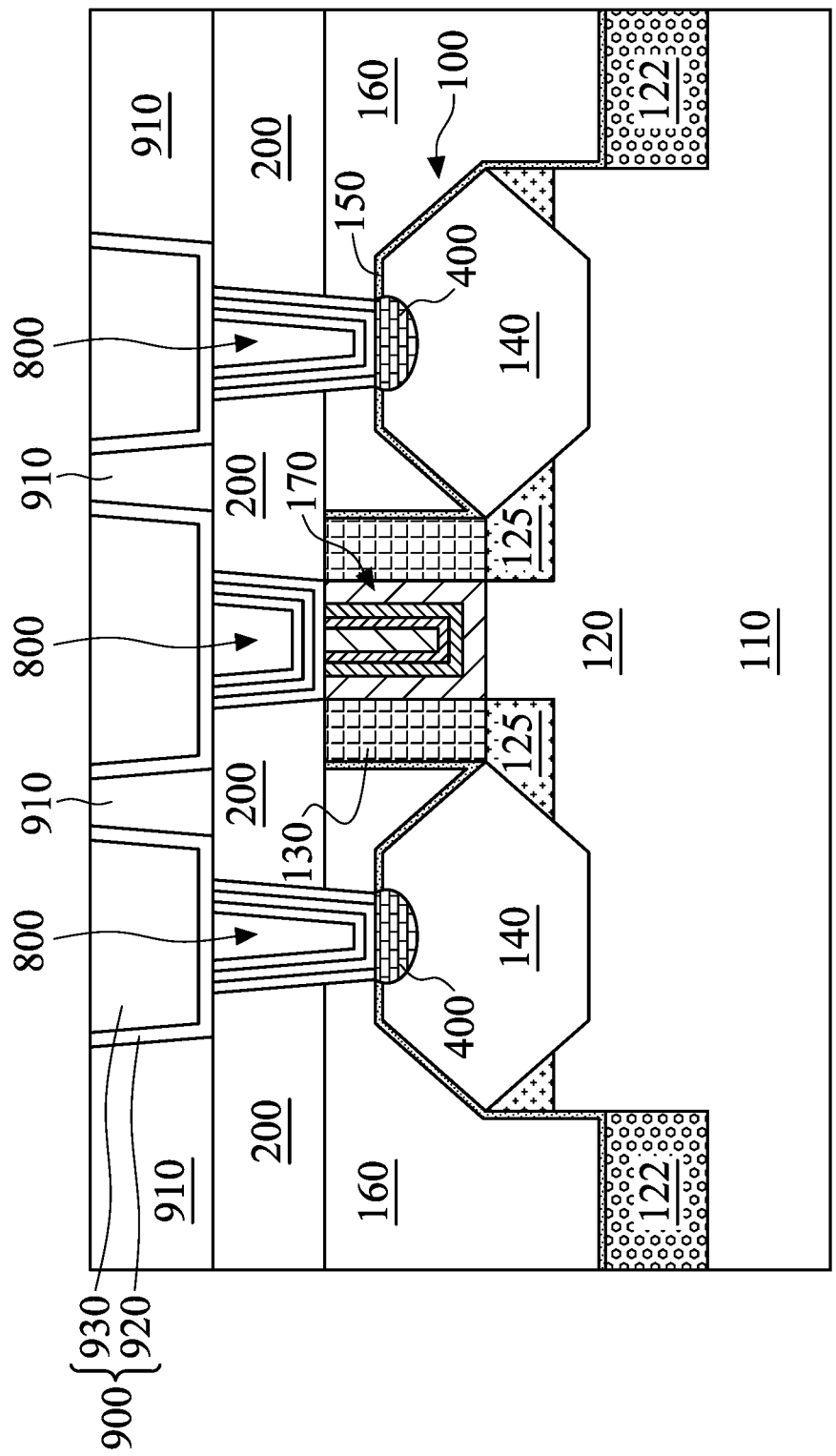
FIGS. 3A and 3B illustrate cross-sectional views of conductive interconnect structures electrically connected to the electrodes of a FinFET in accordance with some embodiments.

FIG. 3A illustrates a cross-sectional view of contact plugs 800 connecting electrodes of FinFET 100 to metal lines 900 formed in a first IMD layer 910. Lines 900 may include a conductive fill layer 930 disposed on top of one or more layers 920 that serves as adhesion/barrier/seed layers. The lines 900 may be formed in a manner similar to that described above with reference to the contact plugs 800 illustrated in FIGS. 2A-2G, omitting the siliciding process steps.

For example, the first IMD layer 910 may be formed and patterned similar to that discussed above with reference to FIG. 2A. The first IMD layer 910 may comprise a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, and may be deposited by any suitable method, such as CVD, HDP-CVD, SACVD, PECVD, FCVD, and spin-on.

Thereafter, layer 920 comprising one more conductive layers may be formed. As noted above, the siliciding steps discussed above may be omitted because the lines 900 will be contacting the contacts 800 as opposed to a semiconductor material. Accordingly, the lines 900 may be formed by forming one or more layers 920, one of which includes a seed layer, and the conductive fill layer 930 which may be formed over the one or more layers 920. The seed layer may be formed and cleaned, and the conductive fill layer 930 may be formed, using the processes and materials described above with reference to FIGS. 2D-2G. In other embodiments, the lines 900 may comprise different materials, formed with different processes and process techniques, or the like than the contacts 800.

Figure 3B:
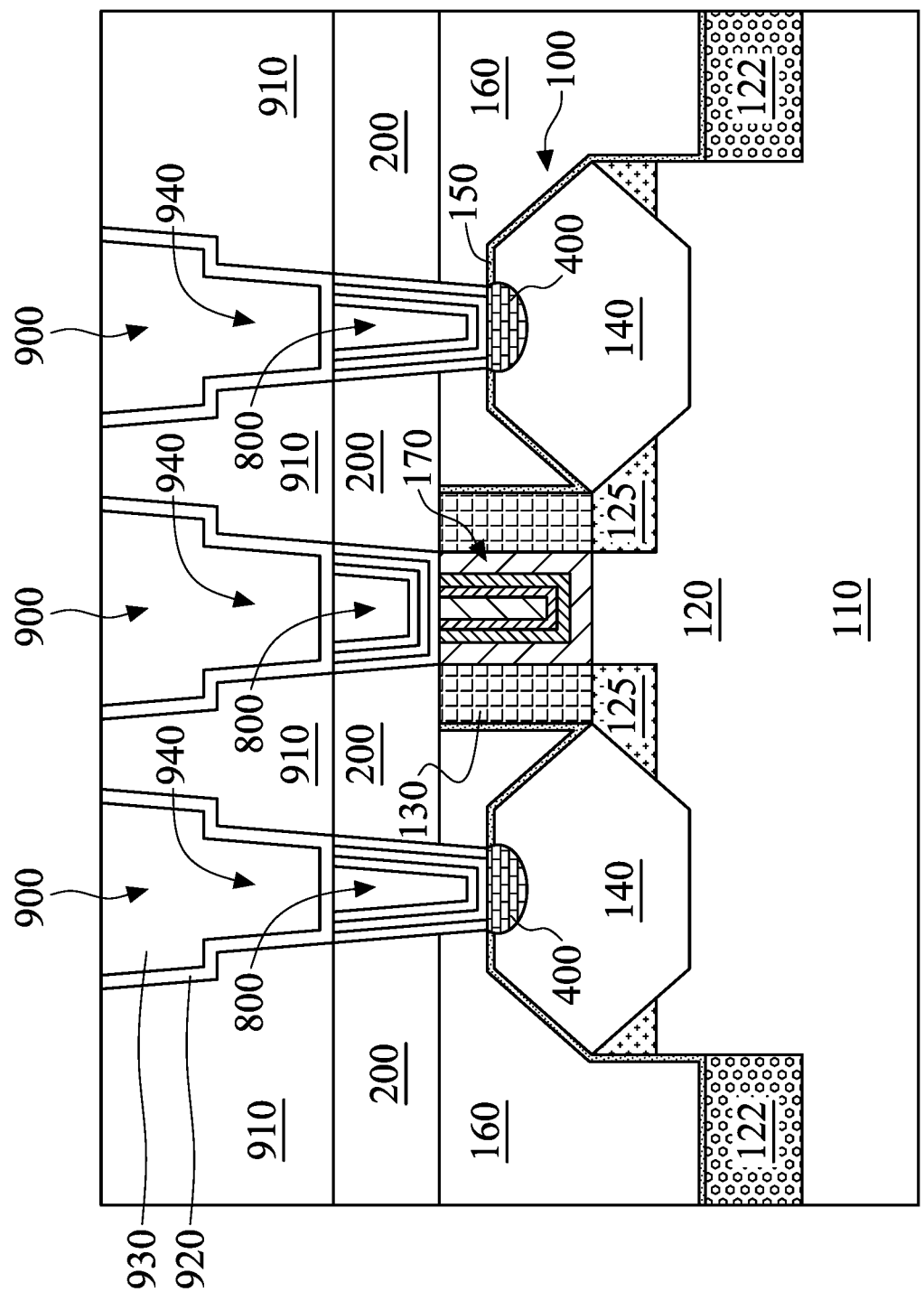

FIG. 3B illustrates a similar structure as FIG. 3A, except vias 940 in FIG. 3B connect the lines 900 to the underlying contacts 800. The lines 900 and vias 940 of FIG. 3B may be formed using a dual-damascene process. The material layers of the lines 900 may be formed using similar materials and processes as those discussed above.

Figure 4:
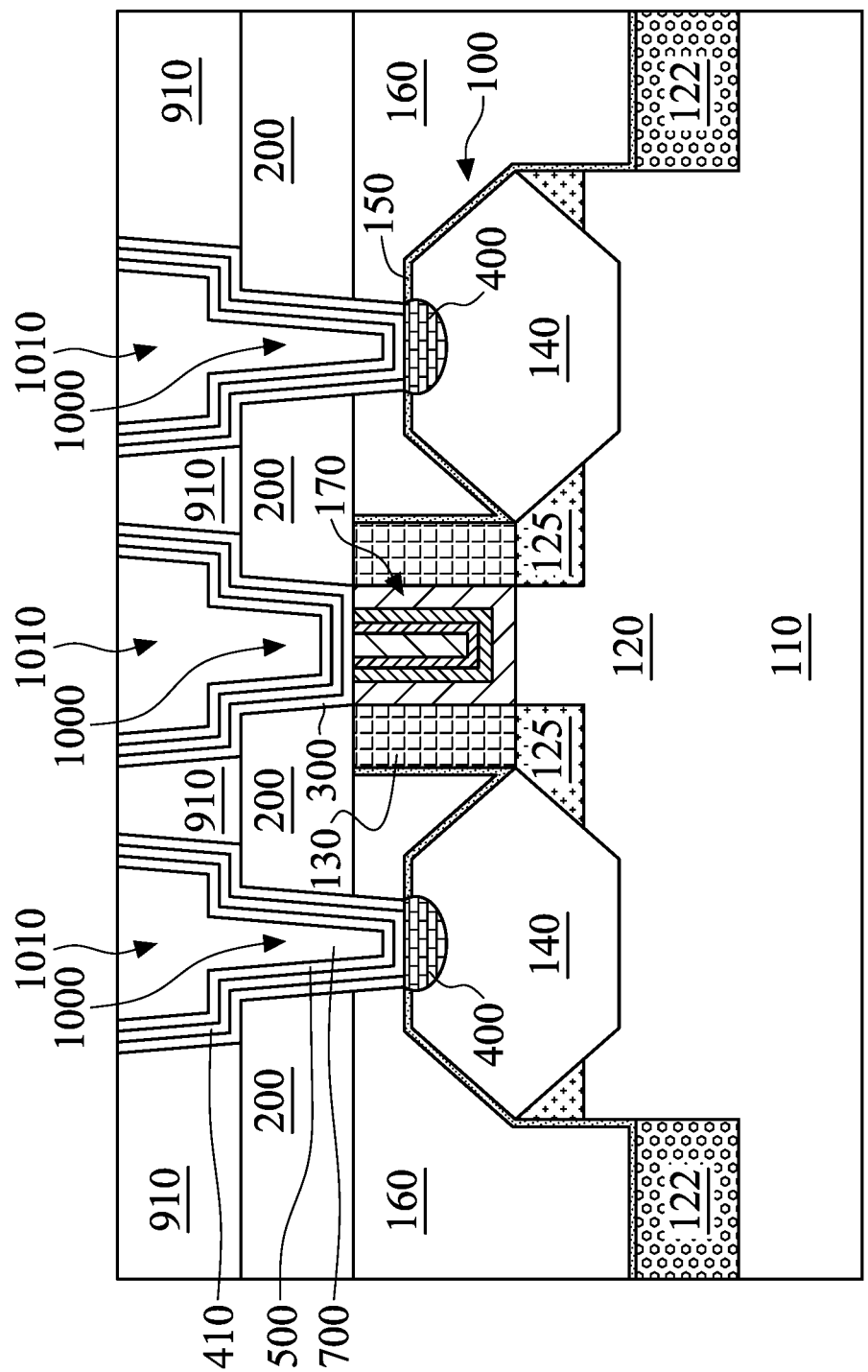
FIG. 4 illustrates a cross-sectional view of conductive interconnect structures electrically connected to the electrodes of a FinFET in accordance with some embodiments.

FIG. 4 illustrates yet another example of a structure formed using the techniques described above. FIG. 4 illustrates a cross-sectional view of electrodes of FinFET 100 connecting to contacts 1000 which are integrally connected to $M_0$ lines 1010. In this example, the first IMD layer 910 is formed prior to forming the contacts 1000. The openings extending through the first IMD layer 910 and the second ILD 200 and the first ILD layer 160 may be formed using, for example dual-damascene processes. After forming the openings, the contacts 1000 may be formed using the processes and materials as described above.

Other structures may also be formed using the processes and materials described above, including lines and vias in the upper metallization layers and the like.

Embodiments of methods for forming conductive interconnect structures (such as, interconnect lines, contacts, and vias), described in this disclosure provide advantages associated with increased conductance of interconnect structures. For example, the in situ surface clean methods described substantially reduce or remove undesirable metal oxide layer at the surface of the metal seed layer formed prior to electrochemical deposition of metal-fill into openings for formation of conductive interconnect structures. The oxide layer would otherwise obstruct electrical current because metal oxides are generally poor electrical conductors. By removing material with poor current conduction properties from the path of current flow in an interconnect structure the current carrying capability of interconnect structures is greatly improved, especially if the physical dimensions of the conductive structure perpendicular to the direction of current flow is made smaller. Thus, the embodiments may lead to scaling to smaller feature sizes and thereby higher packing density of electronic components and interconnect structures in semiconductor integrated circuits. A further advantage of the reactive remote plasma surface treatment process in a cluster tool is that it creates a smoother and more hydrophilic surface over which the electrodeposition of the metal-fill layer would take place. The smoother and more hydrophilic surface leads to a higher percentage of metal coverage along the sidewalls of openings over which the metal-fill layer is deposited thereby reducing defect density and increasing production yields.

In an embodiment, a method of forming a semiconductor device includes forming a dielectric layer over a substrate; forming an opening in the dielectric layer on the substrate; depositing a conductive seed layer along sidewalls and a bottom of the opening; removing at least a portion of an oxide layer from a surface of the conductive seed layer by soaking the substrate in a chemical bath; and after removing the oxide layer, electroplating a conductive layer on the conductive seed layer while the substrate is in the chemical bath. In an embodiment, the method further includes exposing the oxide layer to hydrogen radicals prior to soaking the substrate in the chemical bath. In an embodiment, exposing the oxide layer to hydrogen radicals is performed at least in part using a remote plasma process. In an embodiment, the remote plasma process is performed at a pressure between 10 mTorr and 500 mTorr, a temperature of 30° C. to 500° C., and a time period of 10 seconds to 50 seconds. In an embodiment, vacuum is maintained during and between exposing the oxide layer to hydrogen radicals and soaking the substrate in the chemical bath. In an embodiment, the chemical bath comprises $CoSO_4.7H_2O$, citric acid, hydrochloric acid, and a Co suppressor. In an embodiment, soaking the substrate in the chemical bath is performed for a time period from about 0.75 seconds to about 100 seconds before applying an electroplating current. In an embodiment, soaking the substrate in the chemical bath is performed at a pressure between 1 mTorr and 1000 mTorr, and vacuum is maintained during and between soaking the substrate in the chemical bath and electroplating a conductive layer on the conductive seed layer while the substrate is in the chemical bath.

In an embodiment, a method of forming a semiconductor device includes forming a first dielectric layer over a substrate; forming an opening in the first dielectric layer on the substrate; depositing a conductive seed layer along sidewalls and a bottom of the opening, wherein an oxide layer is formed over a surface of the conductive seed layer; placing the substrate in a vacuum chamber; performing a first pre-treatment process, the first pre-treatment process removing at least a first portion of the oxide layer; after performing the first pre-treatment process, performing a second pre-treatment process, the second pre-treatment process removing at least a second portion of the oxide layer, the second pre-treatment process includes a soak in a chemical bath, the first pre-treatment process being different than the second pre-treatment process; and electroplating a conductive layer over the conductive seed layer prior to removing the substrate from the chemical bath. In an embodiment, the conductive seed layer includes cobalt. In an embodiment, the first pre-treatment process includes exposing the oxide layer to hydrogen radicals using a remote plasma process. In an embodiment, the substrate remains in the chemical bath between the second pre-treatment process and the electroplating. In an embodiment, the method further includes, prior to depositing the conductive seed layer, forming a silicide region on the substrate in the opening. In an embodiment, the substrate includes a second dielectric layer and a metal feature in the second dielectric layer, the metal feature contacting the conductive layer.

In an embodiment, a method of forming a semiconductor device includes forming a first dielectric layer over a substrate, the substrate includes a transistor structure, the transistor includes a first source/drain region, a second source/drain region, a channel region, and a gate structure; forming an opening through the first dielectric layer to the first source/drain region; forming a cobalt seed layer along a bottom and sidewalls of the opening; removing cobalt oxide from the cobalt seed layer by exposing the cobalt seed layer to hydrogen radicals; placing the substrate into an electroplating bath for a delay period, disabling an electroplating current during the delay period, cobalt oxide over the cobalt seed layer being removed during the delay period; and after waiting for the delay period, applying an electroplating current while the substrate remains in the electroplating bath. In an embodiment, the method further includes generating hydrogen radicals using a remote plasma process. In an embodiment, an open circuit potential during the delay period is less than 0.1 V. In an embodiment, the delay period is less than 100 seconds. In an embodiment, applying the electroplating current electroplates cobalt over the cobalt seed layer. In an embodiment, cobalt completely fills the opening after applying the electroplating current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a dielectric layer over a substrate;
    forming an opening in the dielectric layer on the substrate;
    depositing a conductive seed layer along sidewalls and a bottom of the opening, wherein an oxide layer is formed on the conductive seed layer;
    removing at least a portion of the oxide layer from a surface of the conductive seed layer by soaking the substrate in a chemical bath; and
    after removing the oxide layer, electroplating a conductive layer on the conductive seed layer while the substrate is in the chemical bath.

2. The method of claim 1, further comprising:
    prior to soaking the substrate in the chemical bath, exposing the oxide layer to hydrogen radicals.

3. The method of claim 2, wherein exposing the oxide layer to hydrogen radicals is performed at least in part using a remote plasma process.

4. The method of claim 3, wherein the remote plasma process is performed at a pressure between 10 mTorr and 500 mTorr, a temperature of 30° C. to 500° C., and a time period of 10 seconds to 50 seconds.

5. The method of claim 2, further comprising maintaining vacuum during and between the exposing the oxide layer to hydrogen radicals and the soaking the substrate.

6. The method of claim 1, wherein the chemical bath comprises $CoSO_4.7H_2O$, citric acid, hydrochloric acid, and a Co suppressor.

7. The method of claim 1, wherein soaking the substrate in the chemical bath is performed for a time period from about 0.75 seconds to about 100 seconds prior to applying an electroplating current.

8. The method of claim 1, wherein soaking the substrate in the chemical bath is performed at a pressure between 1 mTorr and 1000 mTorr, and further comprising maintaining vacuum during and between the soaking the substrate in the chemical bath and electroplating a conductive layer on the conductive seed layer while the substrate is in the chemical bath.

9. A method of forming a semiconductor device, the method comprising:
- forming a first dielectric layer over a substrate;
- forming an opening in the first dielectric layer on the substrate;
- depositing a conductive seed layer along sidewalls and a bottom of the opening, wherein an oxide layer is formed over a surface of the conductive seed layer;
- placing the substrate in a vacuum chamber;
- performing a first pre-treatment process, the first pre-treatment process removing at least a first portion of the oxide layer;
- after performing the first pre-treatment process, performing a second pre-treatment process, the second pre-treatment process removing at least a second portion of the oxide layer, the second pre-treatment process comprising a soak in a chemical bath, the first pre-treatment process being different than the second pre-treatment process; and
- electroplating a conductive layer over the conductive seed layer prior to removing the substrate from the chemical bath.

10. The method of claim 9, wherein the conductive seed layer comprises cobalt.

11. The method of claim 10, wherein the first pre-treatment process comprises exposing the oxide layer to hydrogen radicals using a remote plasma process.

12. The method of claim 11, wherein the substrate remains in the chemical bath between the second pre-treatment process and the electroplating.

13. The method of claim 9, further comprising, prior to depositing the conductive seed layer, forming a silicide region on the substrate in the opening.

14. The method of claim 9, wherein the substrate comprises a second dielectric layer and a metal feature in the second dielectric layer, the metal feature contacting the conductive layer.

15. A method of forming a semiconductor device, the method comprising:
- forming a first dielectric layer over a substrate, the substrate comprising a transistor, the transistor comprising a first source/drain region, a second source/drain region, a channel region, and a gate structure;
- forming an opening through the first dielectric layer to the first source/drain region;
- forming a cobalt seed layer along a bottom and sidewalls of the opening, wherein a cobalt oxide is formed on the cobalt seed layer;
- removing the cobalt oxide from the cobalt seed layer by exposing the cobalt seed layer to hydrogen radicals;
- placing the substrate into an electroplating bath for a delay period, an electroplating current being disabled during the delay period, cobalt oxide over the cobalt seed layer being removed during the delay period; and
- after waiting for the delay period, applying an electroplating current while the substrate remains in the electroplating bath.

16. The method of claim 15, further comprising generating the hydrogen radicals using a remote plasma process.

17. The method of claim 15, wherein an open circuit potential during the delay period is less than 0.1 volts.

18. The method of claim 15, wherein the delay period is less than 100 seconds.

19. The method of claim 15, wherein applying the electroplating current electroplates cobalt over the cobalt seed layer.

20. The method of claim 19, wherein cobalt completely fills the opening after the applying the electroplating current.

* * * * *